(12) United States Patent
Yu-Sheng et al.

(10) Patent No.: US 6,762,099 B1
(45) Date of Patent: Jul. 13, 2004

(54) METHOD FOR FABRICATING BURIED STRAP OUT-DIFFUSIONS OF VERTICAL TRANSISTOR

(75) Inventors: Hsu Yu-Sheng, Tao-Yuan (TW); Ming-Cheng Chang, Tao-Yuan Hsien (TW); Yinan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/609,533

(22) Filed: Jul. 1, 2003

(51) Int. Cl.[7] .............................................. H01L 21/336
(52) U.S. Cl. ...................... 438/270; 438/212; 438/561; 438/923
(58) Field of Search ................................. 438/156, 192, 438/209, 212, 268, 270, 561, 923, FOR 192, FOR 322

(56) References Cited

U.S. PATENT DOCUMENTS 6,579,759 B1 * 6/2003 Chudzik et al. ............. 438/249
6,638,815 B1 * 10/2003 Bronner et al. ............. 438/246
6,667,504 B1 * 12/2003 Beintner et al. ............ 257/302

* cited by examiner

*Primary Examiner*—George Fourson
*Assistant Examiner*—Fernando L. Toledo
(74) *Attorney, Agent, or Firm*—Winston Hsu

(57) ABSTRACT

A two-stage method for making buried strap out-diffusions is disclosed. A substrate having a deep trench is provided. A first conductive layer is deposited at the bottom of the deep trench. A collar oxide is formed on sidewalls of the deep trench. A second conductive layer is deposited within the deep trench atop the first conductive layer. The collar oxide is then etched back to a predetermined depth. A third conductive layer is deposited directly on the second conductive layer. A trench top oxide (TTO) layer is formed on the third conductive layer. A spacer is formed on the sidewalls of the deep trench. A portion of the TTO layer is etched away to form a recess underneath the spacer, which exposing the substrate in the deep trench. Thereafter, a doping process is carried out to form a first diffusion region through the recess, followed by spacer stripping. Finally, a thermal process is performed to out-diffuse dopants of the second conductive layer to the substrate through the third conductive layer, thereby forming a second diffusion region that merges with the first diffusion region.

17 Claims, 16 Drawing Sheets

METHOD FOR FABRICATING BURIED STRAP OUT-DIFFUSIONS OF VERTICAL TRANSISTOR

BACKGROUND OF THE INVENTION

1. Field of the Invention

The present invention relates generally to a method for fabricating semiconductor devices. More specifically, a two-stage method for making buried strap out-diffusions of a vertical transistor is disclosed for reducing or avoiding potential buried strap out diffusion leakage.

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device. For example, dynamic random access memory devices (DRAMs), which use vertical metal oxide semiconductor field effect transistors (MOSFETs) with deep trench (DT) storage capacitors, have a minimum features size of approximately 0.1. m ~0.15. m. Below that size, the internal electric fields exceed the upper limit for storage node leakage, which decreases retention time below an acceptable level. Therefore, there is a need for different methods and/or different structures to further reduce the size of integrated circuit devices.

Please refer to FIG. 1 to FIG. 7. FIG. 1 to FIG. 7 are schematic diagrams illustrating a method for making a vertical transistor of a deep-trench DRAM unit according to the prior art. As shown in FIG. 1, a deep trench structure 11 is provided in the semiconductor substrate 10. To form the deep capacitor structure 11, a conventional dry etching method such as a reactive ion etching (RIE) is used to etch the semiconductor substrate 10 with a patterned pad layer 14 as an etching mask. A layer of N type doped first polysilicon is deposited at the bottom of the deep trench structure 11, which functions as a storage node of the deep-trench DRAM unit. As shown in FIG. 2, a conformal layer of silicon oxide (not shown) is deposited on the inner surfaces of the deep trench structure 11 and over the pad layer 14. An anisotropic etching process is then carried out to remove the silicon oxide layer laid on top of the pad layer 14 and the silicon oxide layer at the bottom of the deep trench structure 11, leaving the silicon oxide layer on sidewalls 13 of the deep trench structure 11, as indicated by numeral 16, which is hereinafter referred to as a collar oxide layer 16. As shown in FIG. 3, a layer of N type doped second polysilicon 22 is deposited over the first polysilicon. 12 at the bottom of the deep trench structure 11. As shown in FIG. 4, the collar oxide layer 16 on the sidewalls 13 of the deep trench structure 11 is selectively etched to form collar oxide layer 16'.

As shown in FIG. 5, a layer of non-doped third polysilicon 32 is deposited over the second polysilicon layer 22. The third polysilicon 32 is used as a diffusion path for dopants in the second polysilicon layer 22. Through the third polysilicon 32, the dopants such as arsenic or phosphorus out-diffuse to the neighboring substrate body in the subsequent thermal processes.

As shown in FIG. 6, a high-density plasma chemical vapor deposition (HDP CVD) is carried out to deposit a HDP oxide layer (not shown) at the bottom, sidewalls 13 of the deep trench structure 11, and on the top of the pad layer 14.

The HDP oxide layer on the sidewalls 13 of the deep trench structure 11 is much thinner than the HDP oxide layer at the bottom of the deep trench structure 11. Thereafter, an isotropic dry etching is performed to remove the thin HDP oxide layer on the sidewalls 13 of the deep trench structure 11, leaving a thickness of the HDP oxide layer at the bottom of the deep trench structure 11. The remaining HDP oxide layer atop the third polysilicon layer 32 at the bottom of the deep trench structure 11 is denoted and referred to as a Trench Top Oxide (TTO) layer 42. For a deep-trench DRAM having a critical line width of 0.1 micron, the minimum thickness of the TTO layer 42 is about 300 angstroms. Below this limit, the isolation between the vertical transistor and the deep trench capacitor deteriorates.

As shown in FIG. 7, a thermal process is carried out to form a gate-insulating layer 54 on the exposed sidewalls 13 of the deep trench structure 11. During the thermal process, the dopants in the second polysilicon layer 22 out-diffuse to the substrate 10 through the third polysilicon layer 32, thereby forming a buried strap out-diffusion 52, which is used to electrically connect a drain of the vertical transistor with the underlying storage capacitor.

However, the above-mentioned prior art method has several drawbacks. As specifically indicated in FIG. 7, the buried strap out-diffusion 52 has a lateral diffusion length X and a longitudinal diffusion length Y that is substantially equal to the lateral diffusion length X. It is understood that the longitudinal diffusion length Y has to be slightly greater than the thickness of the TTO layer 42 only such that the buried strap out-diffusion 52 can electrically connect the vertical transistor with the deep trench capacitor. By way of example, in a case that the TTO layer 42 is 300-angstrom thick, the longitudinal diffusion length Y of the buried strap out-diffusion 52 is greater than 300 angstroms, say, 400 angstroms. Unfortunately, the lateral diffusion length X of the buried strap out-diffusion 52 will also exceed 300 angstroms. This leads to increased buried strap (BS) leakage because the short distance between two out-diffusions of two adjacent deep trench DRAM units.

Moreover, large lateral diffusion length X of the buried strap out-diffusion 52 also hinders the possibility of further miniaturizing the DRAM cell dimension. In addition, the non-uniformity of the TTO oxide layer 42 results in reliability and process control problems. When the thickness of the TTO oxide layer 42 varies, a longer thermal process is needed to ensure that sufficient longitudinal diffusion length Y of the buried strap out-diffusion 52 is accomplished, and longer thermal process means higher thermal budget and lower throughput.

SUMMARY OF THE INVENTION

Accordingly, it is a primary objective of this invention to provide an improved method for fabricating a vertical transistor to solve the above-mentioned problems.

It is a further objective of this invention to provide a two-stage method for fabricating buried strap out-diffusions of a vertical transistor, thereby reducing or eliminating potential buried strap (BS) leakage and shortening thermal budget.

Briefly summarized, the preferred embodiment of the present invention discloses a two-stage method for fabricating buried strap out-diffusions of vertical transistors. A substrate having a deep trench is provided. A first conductive layer is deposited at the bottom of the deep trench. A collar oxide is formed on sidewalls of the deep trench. A second conductive layer is deposited within the deep trench atop the first conductive layer. The collar oxide is then etched back to a predetermined depth. A third conductive layer is deposited directly on the second conductive layer. A trench top oxide (TTO) layer is formed on the third conductive layer. A spacer is formed on the sidewalls of the deep trench. A portion of the TTO layer is etched away to form a recess underneath the spacer, which exposing the substrate in the deep trench. Thereafter, a doping process is carried out to form a first diffusion region through the recess, followed by spacer stripping. Finally, a thermal process is performed to out-diffuse dopants of the second conductive layer to the substrate through the third conductive layer, thereby forming a second diffusion region that merges with the first diffusion region.

Other objects, advantages, and novel features of the claimed invention will become more clearly and readily apparent from the following detailed description when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 8 to FIG. 16. It is understood that the type of semiconductor regions, device layout, and polarity of voltages are chosen solely for illustration, and persons having ordinary skill in the art would recognize other alternatives, variations, and modifications.

Figure 1:
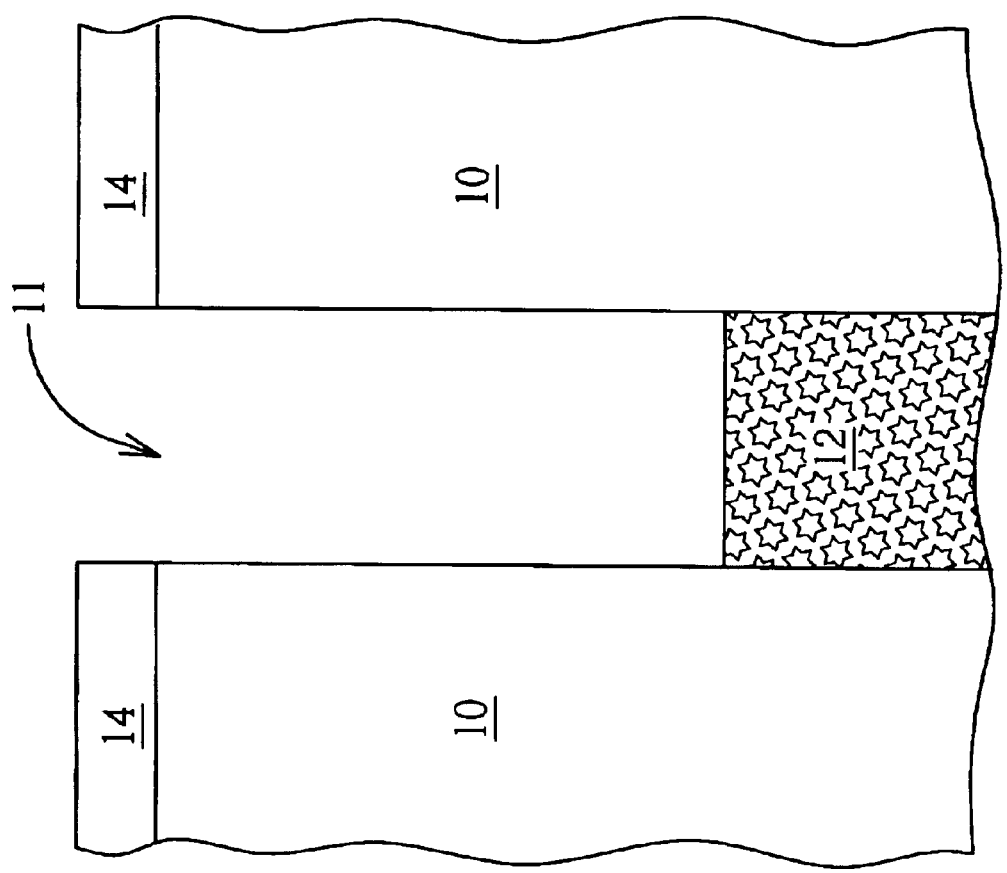
FIG. 1 to FIG. 7 are schematic diagrams illustrating a method for making a vertical transistor of a deep-trench DRAM unit according to the prior art.
Figure 2:
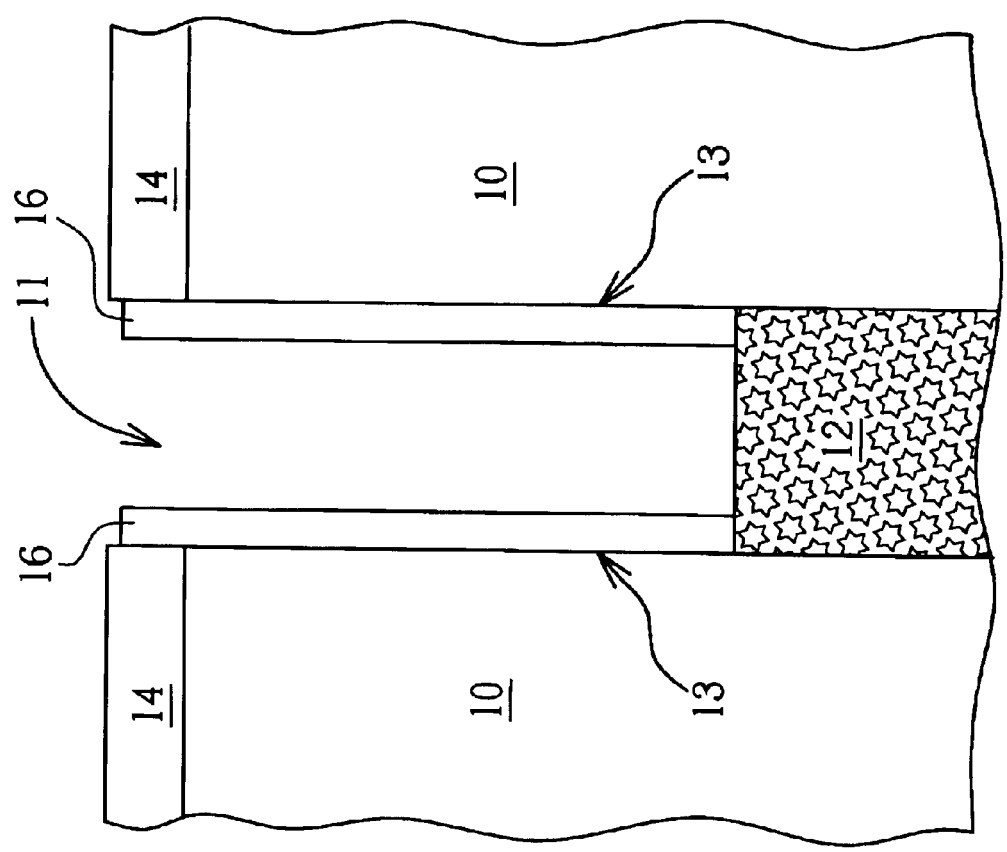
Figure 3:
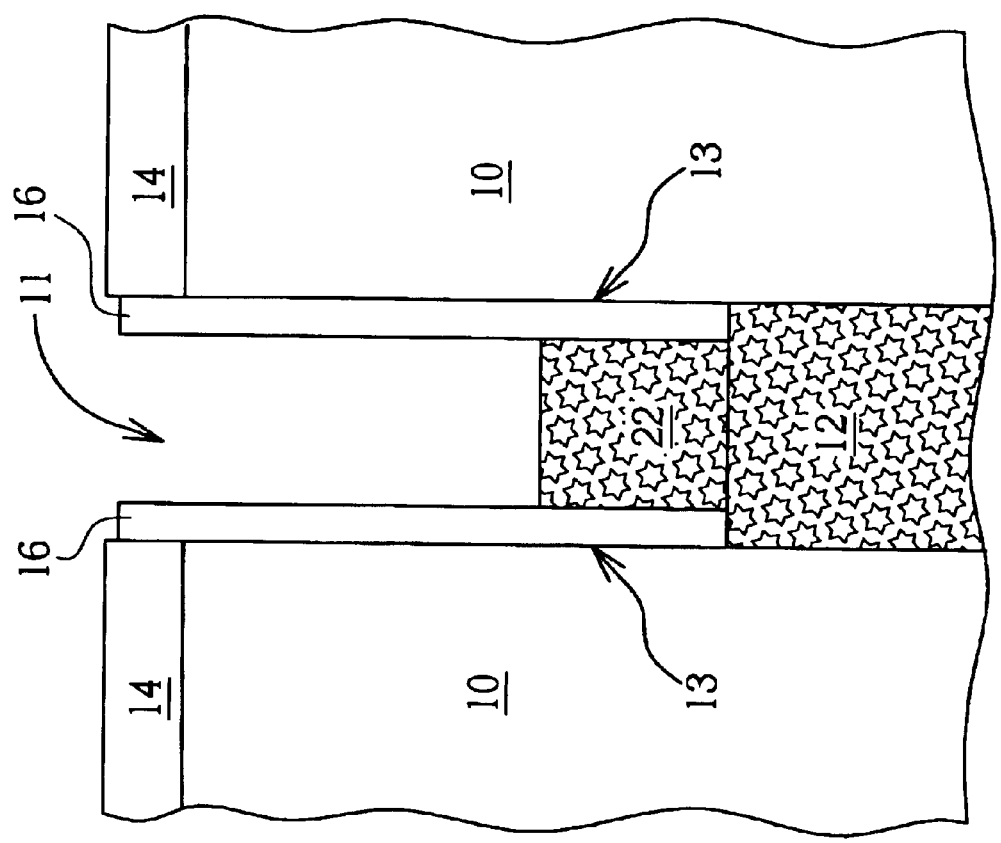
Figure 4:
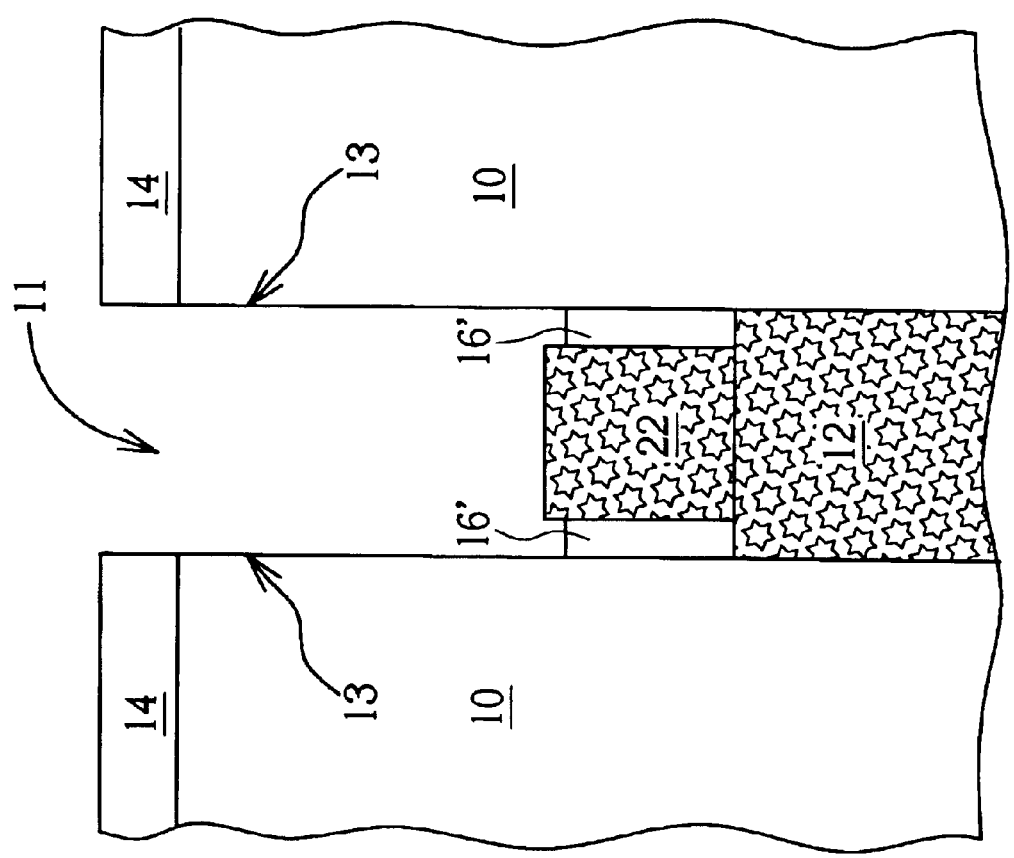
Figure 5:
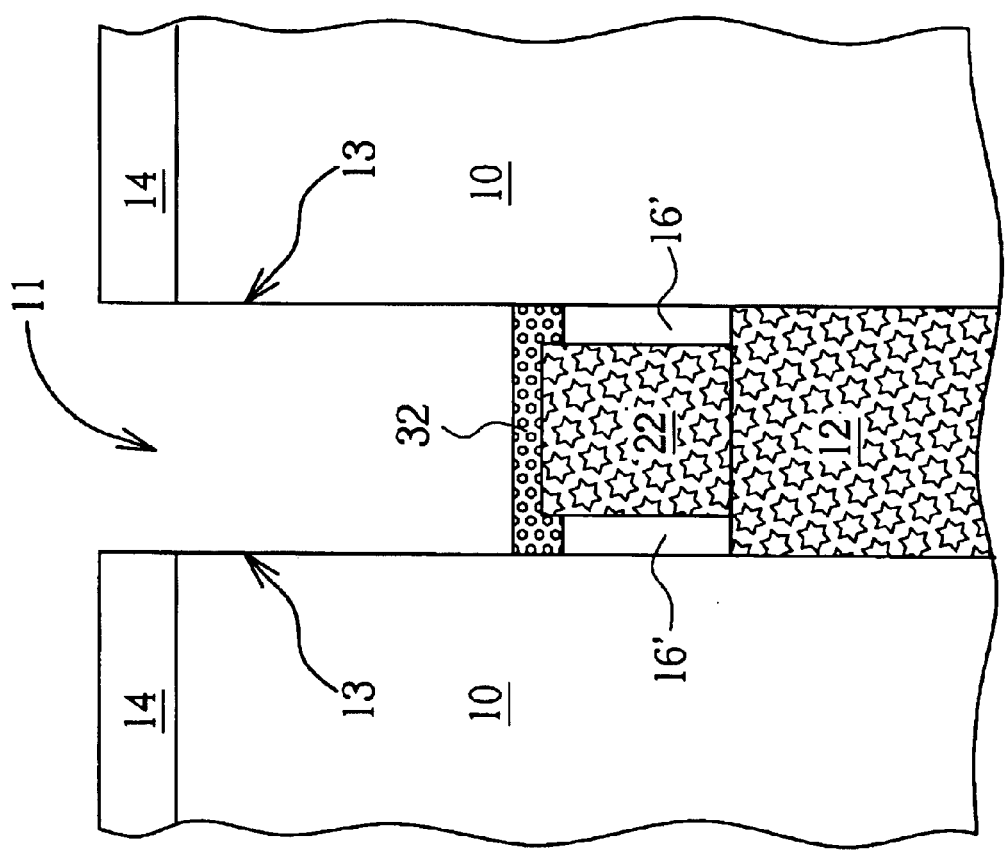
Figure 6:
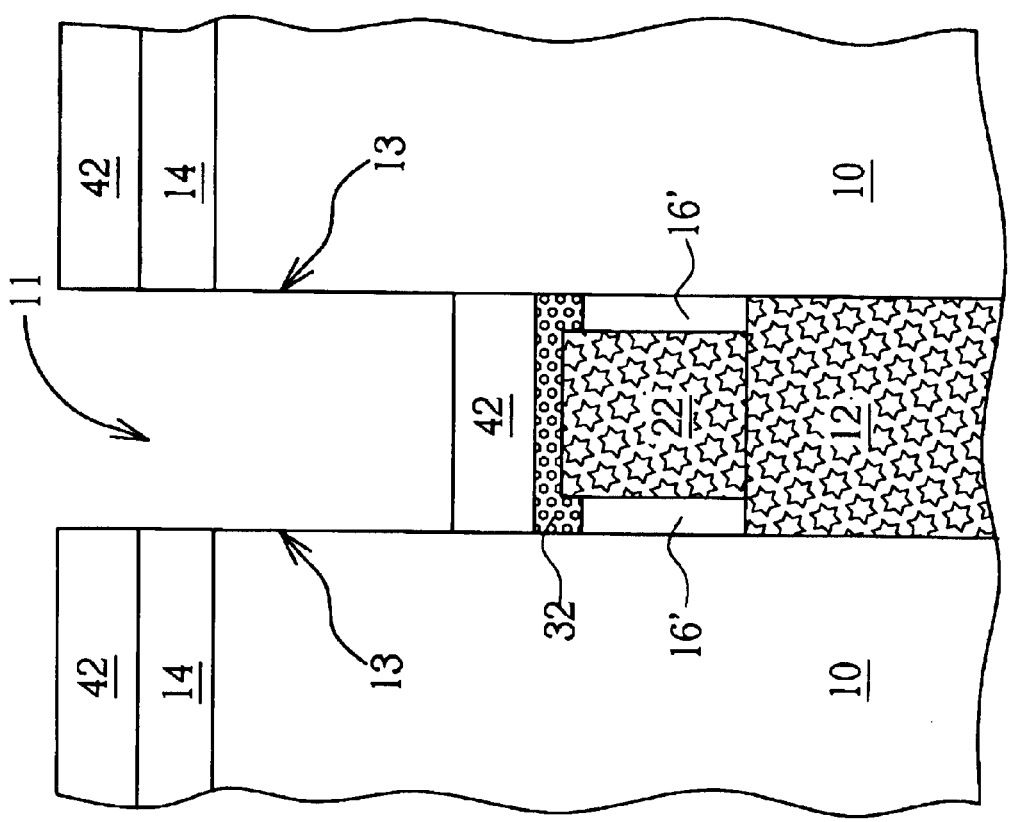
Figure 7:
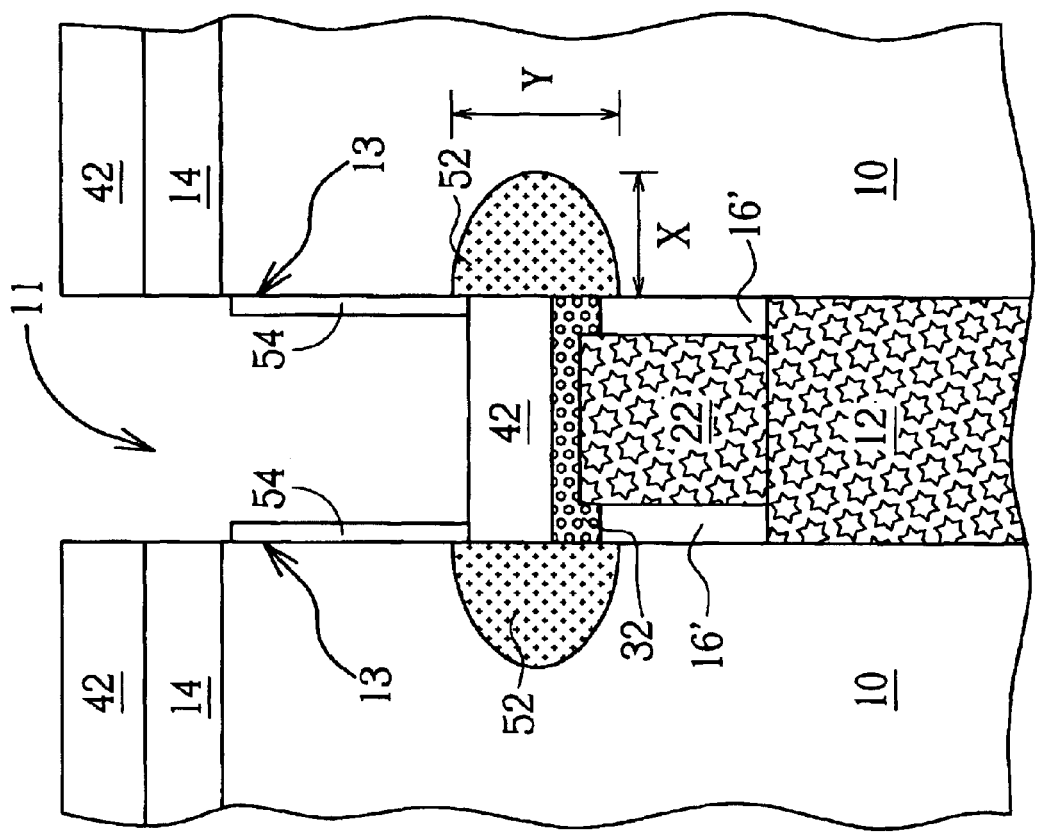
Figure 8:
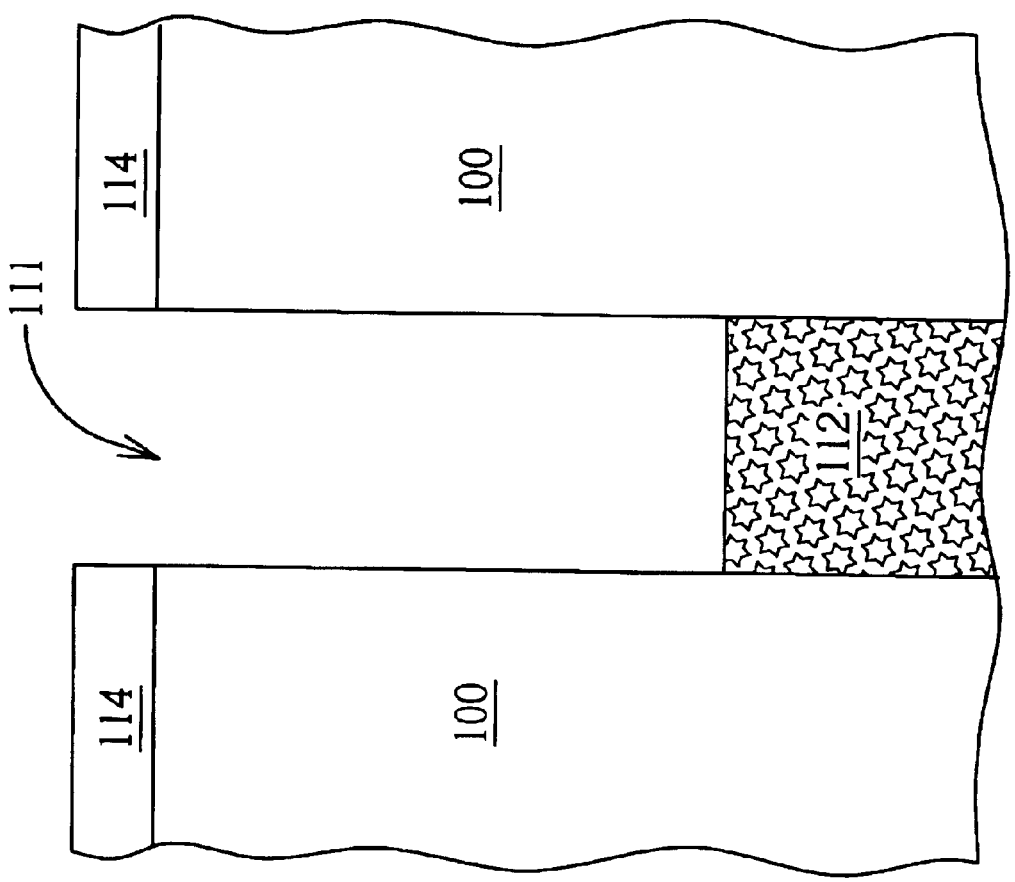
FIG. 8 to FIG. 16 are sectional schematic diagrams illustrating a method for making a vertical transistor of a deep-trench DRAM unit according to the present invention.

Please refer to FIG. 8 to FIG. 16. FIG. 8 to FIG. 16 are sectional schematic diagrams illustrating a method for making a vertical transistor of a deep-trench DRAM unit according to the present invention. As shown in FIG. 8, a deep trench structure 111 is provided in the semiconductor substrate 100. To form the deep capacitor structure 111, a conventional dry etching method such as a reactive ion etching (RIE) is used to etch the semiconductor substrate 100 with a patterned pad layer 114 as an etching mask. The pad layer may be a pad nitride layer, a pad oxide layer, or a nitride/oxide stack layer. Patterning of the pad layer is known in the art. For example, the patterned pad layer 114 may be formed by using conventional photolithography method, followed by an etching step. A first conductive layer 112 such as N type doped first polysilicon is deposited at the bottom of the deep trench structure 111. The first conductive layer 112 functions as a storage node of the deep-trench DRAM unit. The formation of the first conductive layer 112 may be completed by using conventional chemical vapor deposition (CVD) processes, followed by etching back.

Figure 9:
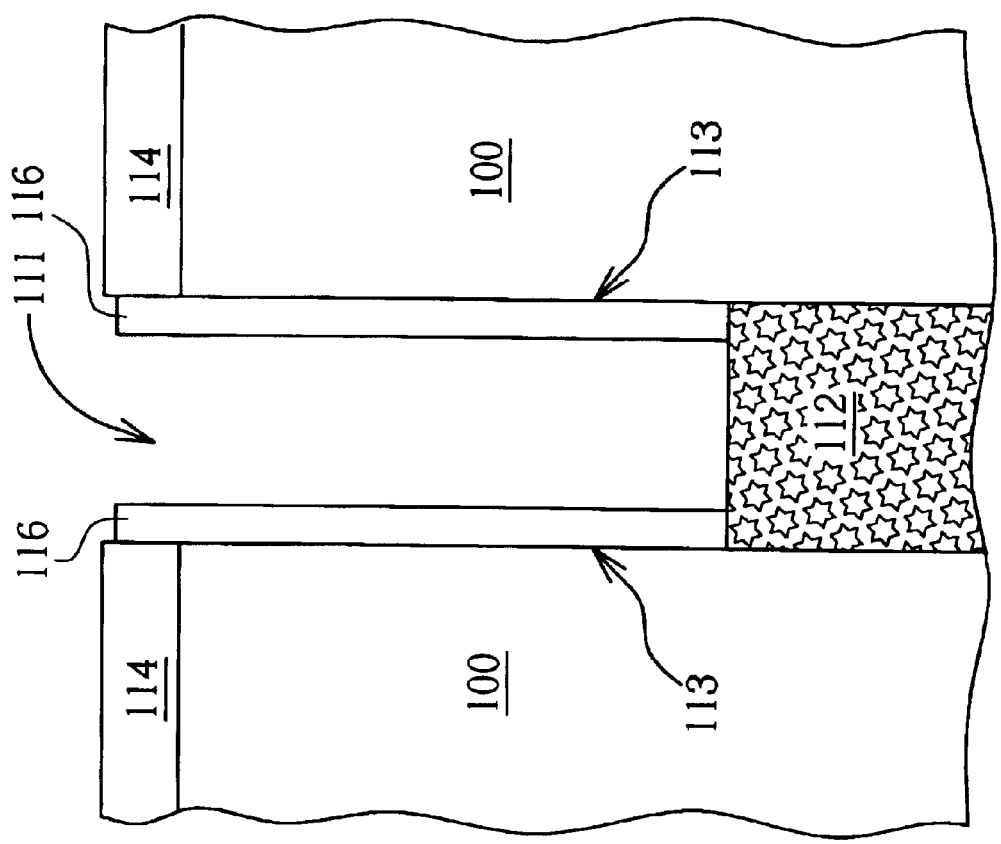

As shown in FIG. 9, a conformal layer of silicon oxide (not shown) is deposited on the inner surfaces of the deep trench structure 111 and over the pad layer 114. The conformal silicon oxide layer may be deposited by conventional CVD. For example, $O_3$-TEOS CVD or LP-TEOS may be used. An anisotropic etching process is then carried out to remove the silicon oxide layer laid on top of the pad layer 114 and the silicon oxide layer at the bottom of the deep trench structure 111, leaving the silicon oxide layer on sidewalls 113 of the deep trench structure 111, as indicated by numeral 116, which is hereinafter referred to as a collar oxide layer 116.

Figure 10:
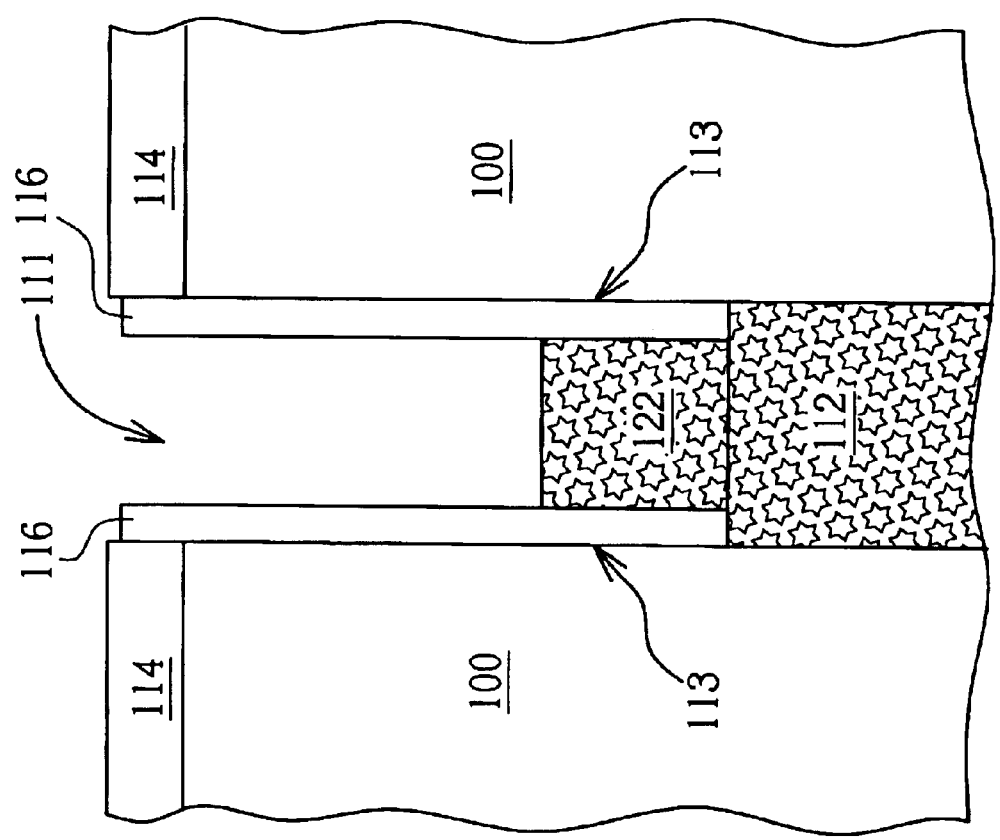
Figure 11:
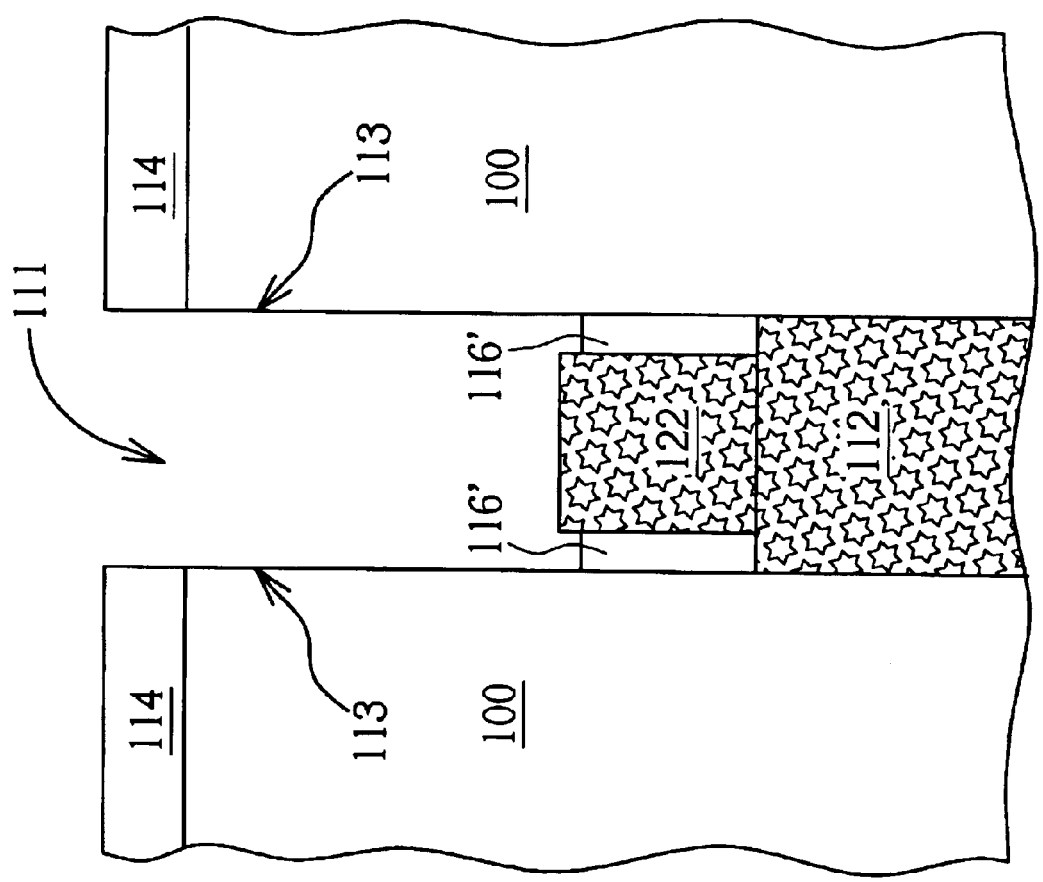

As shown in FIG. 10, a second conductive layer 122 is deposited over the first conductive layer 112 at the bottom of the deep trench structure 111. The second conductive layer 122, which has a thickness of about 100 angstroms, may be made of conductive materials such as N type doped polysilicon or the like. In accordance with the preferred embodiment of this invention, the second conductive layer 122 is made of N type doped polysilicon, which may be formed by conventional CVD and etching methods. As shown in FIG. 11, the collar oxide layer 116 on the sidewalls 113 of the deep trench structure 111 is selectively etched to form collar oxide layer 116'. The exposed top surface of the collar oxide layer 116' may be coplanar with the top surface of the second conductive layer 122. Or, the exposed top surface of the collar oxide layer 116' may be slightly lower than the top surface of the second conductive layer 122. The selectively etching of the collar oxide layer 116 may be done by using wet chemistry that does not affect the second conductive layer 122. For example, HF based wet etching or BOE.

Figure 12:
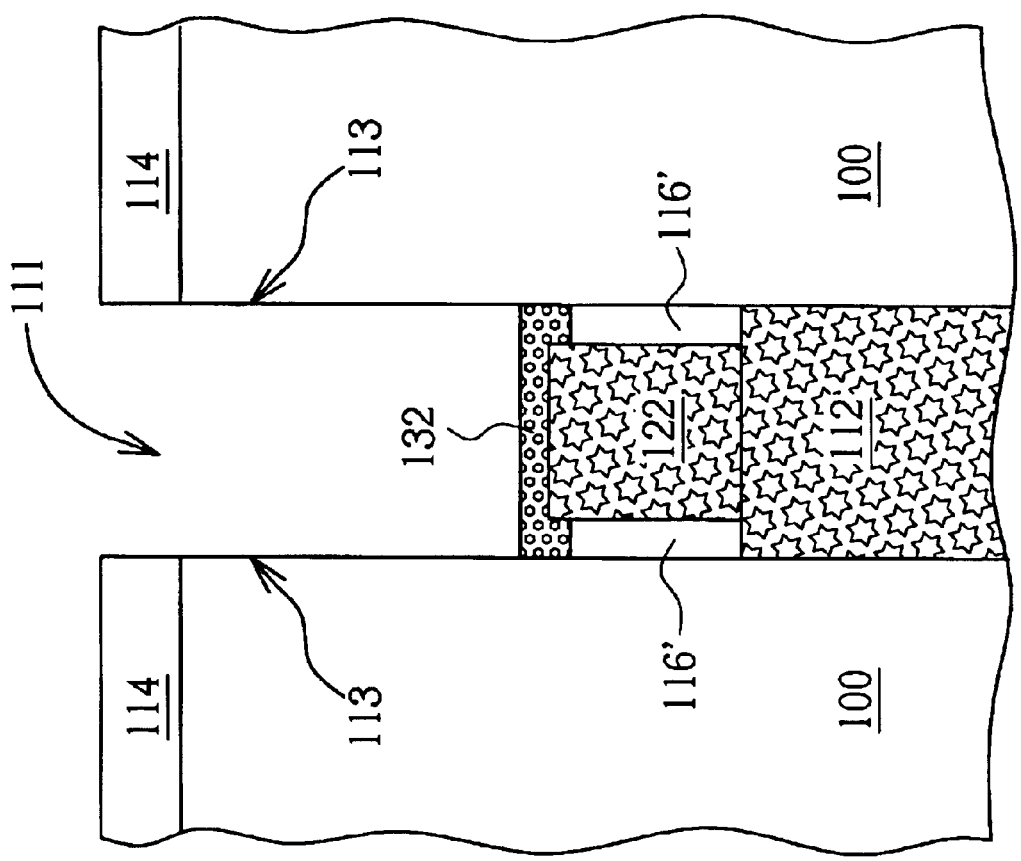

As shown in FIG. 12, a third conductive layer 132 such as nondoped polysilicon is deposited over the second conductive layer 122. The third conductive layer 132 provides a diffusion path for dopants in the second polysilicon layer 122. Through the third conductive layer 132, the dopants such as arsenic or phosphorus out-diffuse to the neighboring substrate body in the subsequent thermal processes. Preferably, the third conductive layer 132 has a thickness of about 50 angstroms to 150 angstroms. The third conductive layer 132 made of non-doped polysilicon may be formed by conventional CVD and etching methods.

Figure 13:
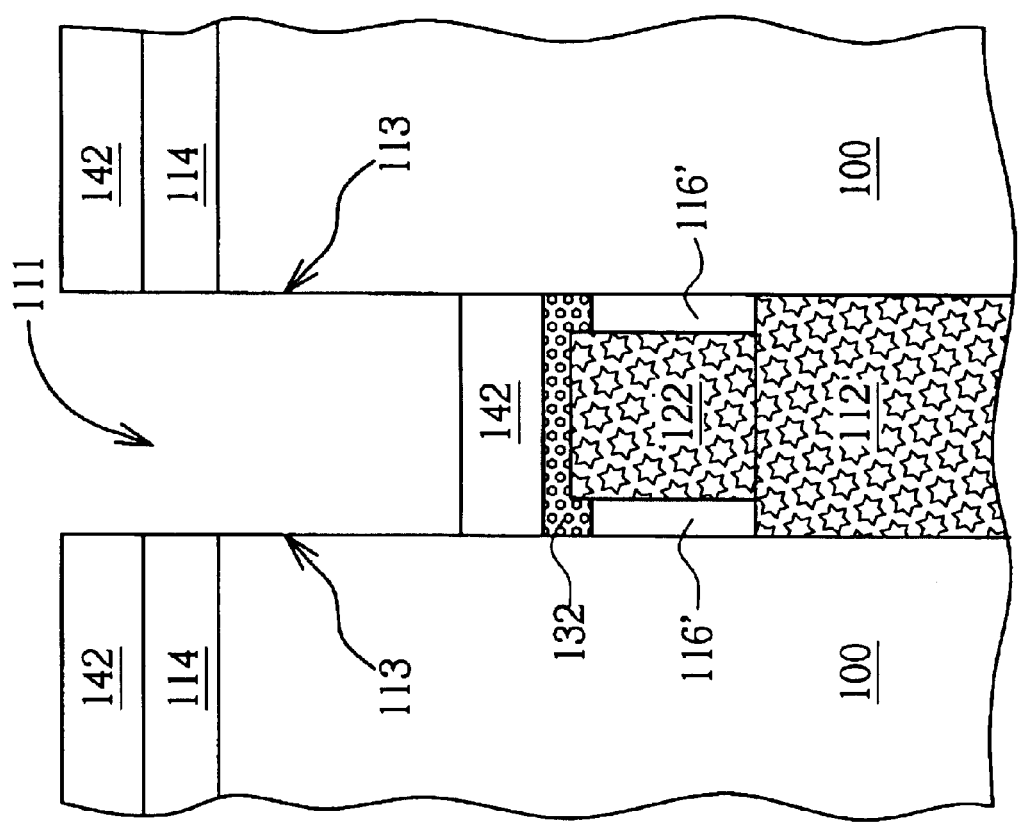

As shown in FIG. 13, a high-density plasma chemical vapor deposition (HDP CVD) is carried out to deposit a HDP oxide layer (not shown) at the bottom, sidewalls 113 of the deep trench structure 111, and on the top of the pad layer 114. The HDP oxide layer on the sidewalls 113 of the deep trench structure 111 is much thinner than the HDP oxide layer at the bottom of the deep trench structure 111. Thereafter, an isotropic dry or wet etching is performed to remove the thin HDP oxide layer on the sidewalls 113 of the deep trench structure 111, leaving a thickness of the HDP oxide layer at the bottom of the deep trench structure 111. The remaining HDP oxide layer atop the third polysilicon layer 32 at the bottom of the deep trench structure 11 is denoted and referred to as a firstTrench Top Oxide (TTO) layer 142. Preferably, the first TTO oxide layer 142 has a thickness of about 200 angstroms to 400 angstroms.

Figure 14:
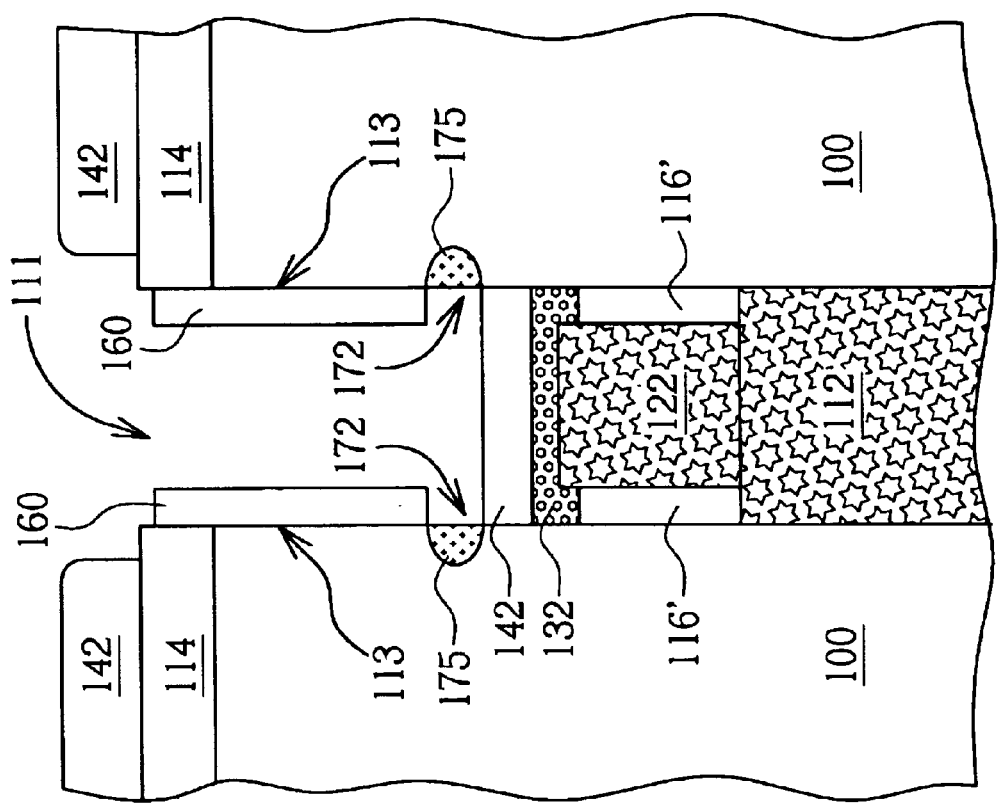

As shown in FIG. 14, a silicon nitride layer (not shown) is deposited on the sidewalls 113 of the deep trench structure 111 and on the first TTO oxide layer 142. An anisotropic dry etching is then carried out to remove the silicon nitride layer on the first TTO oxide layer 142, leaving the silicon nitride layer on the sidewalls 113 of the deep trench structure 111 so as to form silicon nitride spacers 160. Thereafter, a wet etching such as HF wet etching, is used to etch away an upper portion of the first TTO oxide layer 142. In this embodiment, a thickness of 50 to 250 angstroms of the TTO oxide layer 142 is removed, thereby forming a recess 172 underneath the silicon nitride spacers 160. The recess 172 exposes portions of the substrate 100. In accordance with the preferred embodiment of this invention, after back etching the first TTO oxide layer 142, the remaining first TTO oxide layer 142 has a thickness of about 100 angstroms. A gas phase doping (GPD) process is then performed to dope N type dopants such as gas form arsenic into the exposed substrate 100 through the recess 172 so as to form a first doped region 175. In addition to the GPD process as disclosed herein, those skilled in the art would recognize other equivalent means for making the first doped region 175. For example, a conventional arsenic-doped silicon glass deposition (ASG) method may be used.

Figure 15:
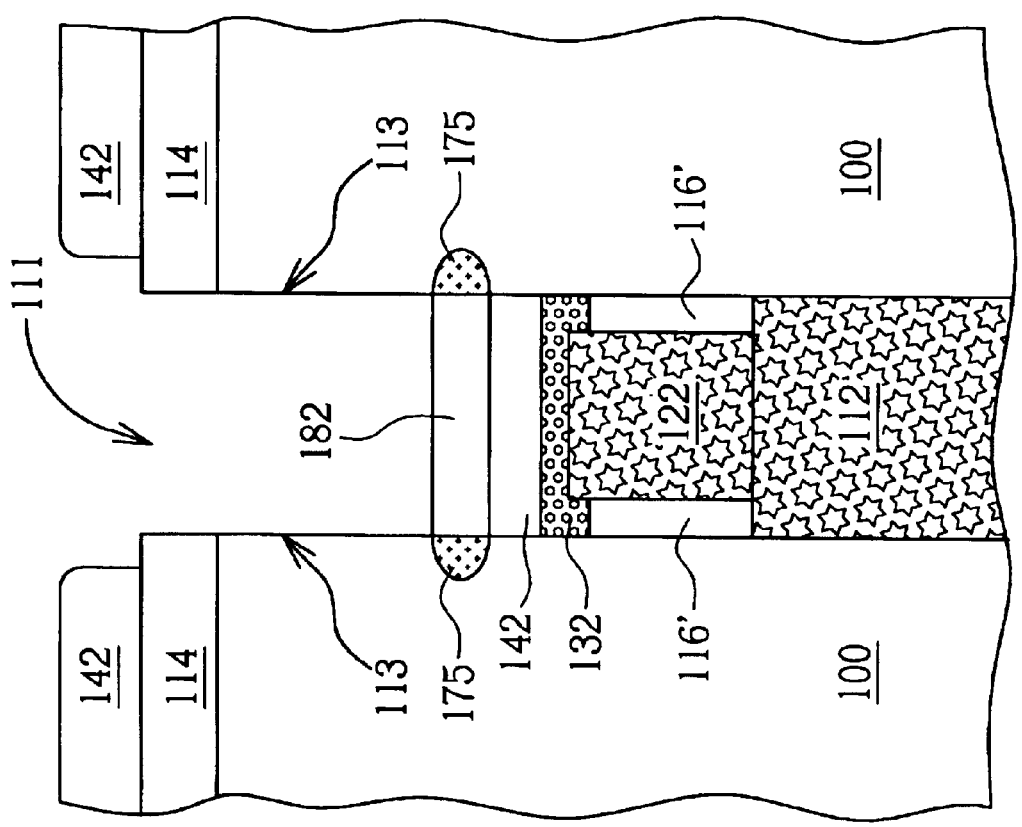

As shown in FIG. 15, the silicon nitride spacers 160 are removed by methods known in the art, for example, hot phosphoric acid solution. Again, another HDPCVD process is performed to deposit a HDP oxide layer (not shown) on the sidewalls 113 of the deep trench structure 111, and on the top of the first TTO oxide layer 142. The HDP oxide layer on the sidewalls 113 of the deep trench structure 111 is much thinner than the HDP oxide layer on the top of the first TTO oxide layer 142. Thereafter, an isotropic dry or wet etching is performed to remove the thin HDP oxide layer on the sidewalls 113 of the deep trench structure 111, leaving a thickness of the HDP oxide layer on the top of the first TTO oxide layer 142, which is denoted and referred to as a second TTO oxide layer 182. In accordance with the preferred embodiment of this invention, the combined thickness of the first TTO oxide layer 142 and the second TTO oxide layer 182 is about 300 angstroms. Preferably, the thickness of the second TTO oxide layer 182 is approximately equal to the removed thickness of the first TTO oxide layer 142. By doing this, isolation between the access transistor and the deep trench capacitor can be well maintained.

Figure 16:
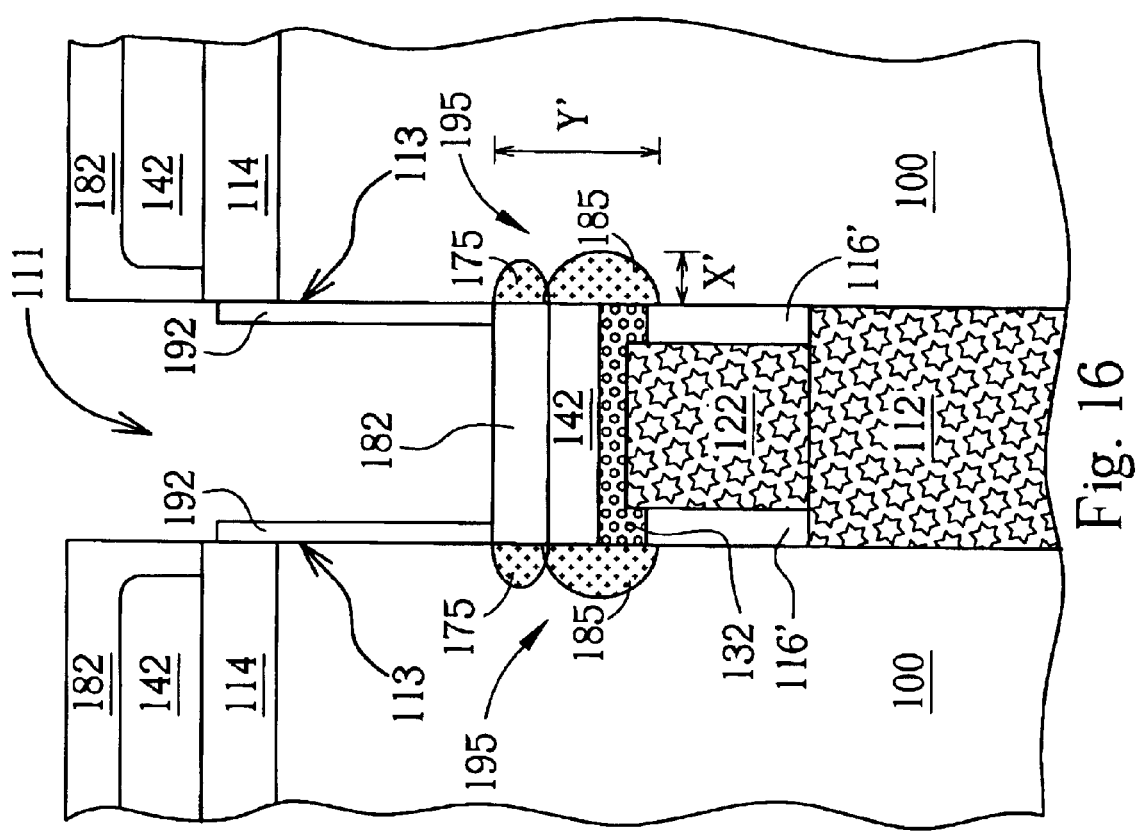

As shown in FIG. 16, a thermal oxidation process is carried out to form a gate oxide layer 192 on the sidewalls 113 of the deep trench structure 111. During the thermal oxidation process, dopnats of the second conductive layer 122 out diffuse to the neighboring substrate 100 by way of the third conductive layer 132 to form a second doped region 185, which is contiguous with the first doped region 175 or overlaps with the first doped region 175. As specifically indicated in FIG. 16, the second doped region 185 has a lateral diffusion length X ' that is smaller than the combination of the thickness of the third conductive layer 132, the thickness of the first TTO oxide layer 142, and the thickness of the second TTO oxide layer 182. The first doped region 175 and the second doped region 185 constitute a buried strap out-diffusion 195 having a longitudinal diffusion length Y'.

In contrast to the prior art, the present invention discloses a two-stage method for making the buried strap out-diffusion 195. According to the present invention, the lateral diffusion length X' of the buried strap out-diffusion 195 is effectively reduced (see FIG. 16). The first doped region 175 and the second doped region 185 constitute the buried strap out-diffusion 195 having a sufficient longitudinal diffusion length Y' that is slightly larger than the combination of the thickness of the third conductive layer 132, the thickness of the first TTO oxide layer 142, and the thickness of the second TTO oxide layer 182. Due to the reduction of the lateral diffusion length X' of the buried strap out-diffusion, the miniaturization of the deep trench DRAM unit is possible and the potential BS leakage is reduced or avoided. Furthermore, since the junction depth of the second doped region is smaller than that of the prior art BS out-diffusion, the process time for thermal treatment and therefore the thermal budget are reduced.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A two-stage method for fabricating buried strap out-diffusions of vertical transistors, comprising the steps of:
   providing a semiconductor substrate having thereon a deep trench;
   depositing a first conductive layer at bottom of the deep trench;
   forming a collar oxide layer on sidewalls of the deep trench;
   depositing a second conductive layer atop the first conductive layer within the deep trench;
   selectively etching back the collar oxide layer;
   depositing a third conductive layer having a first thickness atop the second conductive layer;
   depositing a trench top oxide (TTO) layer having a second thickness on the third conductive layer;
   forming a spacer on each sidewall of the deep trench;
   etching away a portion of the TTO oxide layer to form a recess underneath the spacer, the recess exposing the semiconductor substrate in the deep trench;
   performing a diffusion process to dope dopants into the exposed semiconductor substrate by way of the recess so as to form a first doped region;
   stripping the spacer; and performing a thermal process to out-diffuse dopants in the second conductive layer to the semiconductor substrate through the third conductive layer so as to form a second doped region that merges with the first doped region, wherein the first doped region and the second doped region constitute a buried strap out-diffusion.

2. The two-stage method for fabricating buried strap out-diffusions of vertical transistors as claimed in claim 1 wherein the step of etching away a portion of the TTO oxide layer to form a recess underneath the spacer uses isotropic etching.

3. The two-stage method for fabricating buried strap out-diffusions of vertical transistors as claimed in claim 1 wherein the first conductive layer is made of doped polysilicon.

4. The two-stage method for fabricating buried strap out-diffusions of vertical transistors as claimed in claim 1 wherein the second conductive layer is made of doped polysilicon.

5. The two-stage method for fabricating buried strap out-diffusions of vertical transistors as claimed in claim 1 wherein the third conductive layer is made of non-doped polysilicon.

6. The two-stage method for fabricating buried strap out-diffusions of vertical transistors as claimed in claim 1 wherein the second doped region has a longitudinal diffusion length smaller than the combination of the first thickness and the second thickness.

7. The two-stage method for fabricating buried strap out-diffusions of vertical transistors as claimed in claim 1 wherein the first thickness is between 50 angstroms and 150 angstroms.

8. The two-stage method for fabricating buried strap out-diffusions of vertical transistors as claimed in claim 1 wherein the second thickness is between 200 angstroms and 400 angstroms.

9. The two-stage method for fabricating buried strap out-diffusions of vertical transistors as claimed in claim 1 wherein the spacer is silicon nitride spacer.

10. The two-stage method for fabricating buried strap out-diffusions of vertical transistors as claimed in claim 1 wherein during the thermal process a gate oxide layer is formed on the sidewall of the deep trench.

11. A two-stage method for fabricating buried strap out-diffusions of vertical transistors, comprising the steps of:
provide a semiconductor substrate having thereon a deep trench;
depositing a first conductive layer at bottom of the deep trench;
forming a collar oxide layer on sidewalls of the deep trench;
depositing a second conductive layer atop the first conductive layer within the deep trench;
etching back the collar oxide layer;
depositing a third conductive layer having a first thickness atop the second conductive layer;
depositing a first trench top oxide (TTO) layer having a second thickness on the third conductive layer;
forming a spacer on each sidewall of the deep trench;
etching away a portion of the first TTO oxide layer to form a recess underneath the spacer, the recess exposing the semiconductor substrate in the deep trench;
performing a diffusion process to dope dopants into the exposed semiconductor substrate by way of the recess so as to form a first doped region;
stripping the spacer;
depositing a second TTO layer atop the first TTO layer; and
performing a thermal process to out-diffuse dopants in the second conductive layer to the semiconductor substrate through the third conductive layer so as to form a second doped region that merges with the first doped region, wherein the first doped region and the second doped region constitute a buried strap out-diffusion.

12. The two-stage method for fabricating buried strap out-diffusions of vertical transistors as claimed in claim 11 wherein the second doped region has a longitudinal diffusion length smaller than the combination of the first thickness and the second thickness.

13. The two-stage method for fabricating buried strap out-diffusions of vertical transistors as claimed in claim 11 wherein the spacer is silicon nitride spacer.

14. The two-stage method for fabricating buried strap out-diffusions of vertical transistors as claimed in claim 11 wherein during the thermal process a gate oxide layer is formed on the sidewall of the deep trench.

15. The two-stage method for fabricating buried strap out-diffusions of vertical transistors as claimed in claim 11 wherein the first conductive layer is made of doped polysilicon.

16. The two-stage method for fabricating buried strap out-diffusions of vertical transistors as claimed in claim 11 wherein the second conductive layer is made of doped polysilicon.

17. The two-stage method for fabricating buried strap out-iffusions of vertical transistors as claimed in claim 11 wherein the third conductive layer is made of non-doped polysilicon.

* * * * *